United States Patent
Shiomi et al.

(10) Patent No.: US 8,013,343 B2
(45) Date of Patent: Sep. 6, 2011

(54) SILICON CARBIDE SINGLE CRYSTAL, SILICON CARBIDE SUBSTRATE AND MANUFACTURING METHOD FOR SILICON CARBIDE SINGLE CRYSTAL

(75) Inventors: Hiromu Shiomi, Kyoto (JP); Hiroyuki Kinoshita, Kyoto (JP)

(73) Assignee: Sumitomo Electric Industries, Ltd., Osaka-Shi (JP)

( * ) Notice: Subject to any disclaimer, the term of this patent is extended or adjusted under 35 U.S.C. 154(b) by 0 days.

(21) Appl. No.: 11/258,998

(22) Filed: Oct. 27, 2005

(65) Prior Publication Data

US 2006/0091402 A1    May 4, 2006

(30) Foreign Application Priority Data

Oct. 29, 2004    (JP) .................... 2004-316458

(51) Int. Cl.
*H01L 29/36* (2006.01)
*C30B 23/02* (2006.01)
*C01B 31/36* (2006.01)

(52) U.S. Cl. .............. 257/77; 257/607; 257/E29.104; 257/E29.109; 257/E21.054; 438/510; 438/931; 423/345

(58) Field of Classification Search ........... 257/E21.541, 257/E21.605, 77, 607, 610, E29.104, E29.109, 257/E21.054; 117/84, 928; 438/510, 547, 438/931; 423/345–346
See application file for complete search history.

(56) References Cited

U.S. PATENT DOCUMENTS

| | | | |
|---|---|---|---|
| 3,615,930 A * | 10/1971 | Knippenber et al. ......... | 117/105 |
| 3,634,149 A * | 1/1972 | Knippenberg et al. ......... | 117/87 |
| 5,611,955 A | 3/1997 | Barrett et al. | |
| 5,856,231 A * | 1/1999 | Niemann et al. .............. | 438/519 |
| 6,025,289 A | 2/2000 | Carter et al. | |
| 6,133,120 A * | 10/2000 | Miyajima et al. ............. | 438/478 |
| 6,200,917 B1 | 3/2001 | Carter et al. | |
| 6,218,680 B1 * | 4/2001 | Carter et al. .................... | 257/77 |

(Continued)

FOREIGN PATENT DOCUMENTS

JP    10-67600 A    3/1998

(Continued)

OTHER PUBLICATIONS

Konovalov, V.V., et al. "Electron Paramagnetic Resonance Studies of a Carbon Vacancy-Related Defect in As-Grown 4H-SiC." Physica B, vol. 308-310 (2001): pp. 671-674.*

Konovalov, V.V., et al. "Interactions Between Intrinsic Defects and Nitrogen/Boron Impurities in High-Resistivity 4H SiC: Electron Paramagnetic Resonance Study." J. Elect. Mater., vol. 31, No. 5 (2002): pp. 351-355.*

(Continued)

Primary Examiner — Matthew W Such
(74) Attorney, Agent, or Firm — Birch, Stewart, Kolasch & Birch, LLP

(57) ABSTRACT

SiC single crystal that includes a first dopant functioning as an acceptor, and a second dopant functioning as a donor is provided, where the content of the first dopant is no less than $5 \times 10^{15}$ atoms/cm$^3$, the content of the second dopant is no less than $5 \times 10^{15}$ atoms/cm$^3$, and the content of the first dopant is greater than the content of the second dopant. A manufacturing method for silicon carbide single crystal is provided with the steps of: fabricating a raw material by mixing a metal boride with a material that includes carbon and silicon; vaporizing the raw material; generating a mixed gas that includes carbon, silicon, boron and nitride; and growing silicon carbide single crystal that includes boron and nitrogen on a surface of a seed crystal substrate by re-crystallizing the mixed gas on the surface of the seed crystal substrate.

5 Claims, 1 Drawing Sheet

U.S. PATENT DOCUMENTS

| | | | |
|---|---|---|---|
| 6,270,573 | B1 | 8/2001 | Kitabatake et al. |
| 6,639,247 | B2 * | 10/2003 | Carter et al. .................... 257/77 |
| 2001/0023945 | A1 * | 9/2001 | Carter et al. .................... 257/77 |
| 2002/0104478 | A1 * | 8/2002 | Oguri et al. ................... 117/104 |
| 2002/0167010 | A1 * | 11/2002 | Mueller .......................... 257/77 |
| 2003/0233975 | A1 * | 12/2003 | Jenny et al. .................... 117/30 |
| 2004/0201024 | A1 * | 10/2004 | Tsvetkov et al. ............... 257/77 |
| 2008/0190355 | A1 * | 8/2008 | Chen et al. ....................... 117/3 |

FOREIGN PATENT DOCUMENTS

| | | |
|---|---|---|
| JP | 2003-500321 A | 1/2003 |
| JP | 2003-104798 A | 4/2003 |
| JP | 2006-1784 A | 1/2006 |
| JP | 2008-505833 A | 2/2008 |
| KR | 2000-0068834 A | 11/2000 |
| WO | WO-00/71787 A2 | 11/2000 |
| WO | WO-02/097173 A2 | 12/2002 |
| WO | WO-2006/017074 A2 | 2/2006 |

OTHER PUBLICATIONS

Zvanut, M.E. and Konovalov, V.V. The Level Position of a Deep Intrinsic Defect in 4H-SiC Studied by Photoinduced Electron Paramagnetic Resonance. Appl. Phys. Lett., vol. 80, No. 3 (Jan. 21, 2002): pp. 410-412.*

Gupta, A., "6H and 4H-SiC Bulk Growth by PVT and Advanced PVT (APVT)." Mat. Res. Soc. Symp. Proc., vol. 815, J5.24 (2004): pp. 15-20.*

Ellison, A., "HTCVD Growth of Semi-Insulating 4H-SiC Crystals with Low Defect Density." Mat. Res. Soc. Symp. Proc., vol. 640, H1.2.1 (2001).*

Jenny, J.R., "High-Purity Semi-Insulating 4H-SiC Grown by the Seeded-Sublimation Method." J. Elect. Mater., vol. 31, No. 5 (2002): pp. 366-369.*

Carlos, W.E., "Optical and Magnetic Resonance Signatures of Deep Levels in Semi-Insulating 4H SiC." Physica B, vol. 340-342 (2003): pp. 151-155.*

Lebedev, A.A. "Deep Level Centers in Silicon Carbide: A Review." Semiconductors, vol. 33, No. 2 (Feb. 1999): pp. 107-130.*

Glass, R.C., et al. The Role of Residual Impurities in SiC Grown by Physical Vapor Transport. Proc. Int'l. Conf. On SiC, 1995, Int. of Physics. pp. 37-40.*

Madelung, O. Semiconductors—Basic Data. 2nd Ed. Springer (1996): pp. 53.*

Jenny, J.R., et al. "Optical and Electrical Characterization of Boron Impurities in Silicon Carbide Grown by Physical Vapor Transport." J. Appl. Phys., vol. 79, No. 5 (Mar. 1, 1996): pp. 2326-2331.*

Jenny, J.R., et al. "High-Purity Semi-Insulating 4H-SiC for Microwave Device Applications." J. Elect. Mater., vol. 32, No. 5 (2003): pp. 432-436.*

Bickermann, M., et al. "On the Preparation of Semi-Insulating SiC Bulk Crystals by the PVT Technique." Appl. Surf. Sci., vol. 184 (2001): pp. 84-89.*

Bickermann, M., et al. "Incorporation of Boron and Vanadium During PVT Growth of 65H-SiC Crystals." J. Cryst. Growth, vol. 233 (2001): pp. 211-218.*

Augustine, G., et al. "Growth and Characterization of High-Purity SiC Single Crystals." J. Cryst. Growth, vol. 211 (2000): pp. 339-342.*

Grosse, P., et al. "Influence fo Reactor Cleanness and Process Conditions on the Growth of PVT and the Purity of 4H and 6H SiC Crystals." Mater. Sci. & Eng. B, vol. 61-62 (1999): pp. 58-62.*

Syvajarvi, M., et al. "Optical Properties of Aluminum and Nitrogen in Compensated 4H-SiC Epitaxial Layers." Mat. Res. Soc. Symp., vol. 640 (2001): pp. H7.10.1-H7.10.6.*

Bickermann, M. et al. "Preparation of Semi-Insulating Silicon Carbide by Vanadium Doping during PVT Bulk Crystal Growth." Mater. Sci. Forum, vol. 433-436 (2003): pp. 51-54.*

Bickermann, M. et al. "Study of Boron Incorporation during PVT Growth of p-Type SiC Crystals." Mater. Sci. Forum, vol. 353-356 (2001): pp. 49-52.*

Ellison, A., et al. "HTCVD Grown Semi-Insulating SiC Substrates." Mater. Sci. Forum, vol. 433-436 (2003): pp. 33-38.*

Hobgood, H.M., et al. "Large Diameter 6H-SiC for Microwave Device Applications." J. Cryst. Growth, vol. 137 (1994): pp. 181-186.*

Hobgood, H.M., et al. "Silicon Carbide Crystal and Substrates Technology: A Survey of Recent Advances." Mater. Sci. Forum, vol. 457-460 (2004): pp. 3-8.*

Muller, S.G., et al. "Sublimation-Grown Semi-Insulating SiC for High Frequency Devices." Mater. Sci. Forum, vol. 433-436 (2003): pp. 39-44.*

Son, N. T., et al. "Defects in Semi-Insulating SiC Substrates." Mater. Sci. Forum, vol. 433-436 (2003): pp. 45-50.*

M. Bickermann et al.; "Incorporation of boron and vanadium during PVT growth of 6H-SiC crystals"; Journal of Crystal Growth, vol. 233; 2001; pp. 211-218, XP4300597A.

Japanese Office Action mailed Jul. 14, 2009.

* cited by examiner

SILICON CARBIDE SINGLE CRYSTAL, SILICON CARBIDE SUBSTRATE AND MANUFACTURING METHOD FOR SILICON CARBIDE SINGLE CRYSTAL

This nonprovisional application is based on Japanese Patent Application No. 2004-316458 filed with the Japan Patent Office on Oct. 29, 2004, the entire contents of which are hereby incorporated by reference.

BACKGROUND OF THE INVENTION

1. Field of the Invention

The present invention relates to silicon carbide (SiC) single crystal, a SiC substrate and a manufacturing method for SiC single crystal, and in particular, to p type SiC single crystal having high resistivity, a SiC substrate and a manufacturing method for SiC single crystal.

2. Description of the Background Art

SiC has a band gap that is approximately 3 times greater than that of silicon (Si), a dielectric breakdown voltage that is approximately 10 times higher than that of Si, an electron saturation speed that is approximately twice greater than that of Si, and thermal conductivity that is approximately 3 times greater than that of Si, as well as properties that Si does not have. In addition, SiC is a thermally and chemically stable semiconductor material, and on the basis of these properties, and, in recent years, has come to be expected to be applied to power devices that exceed the physical limit of Si devices, or to environment resistant devices that operate at a high temperatures.

In addition, in research relating to optical devices, gallium nitride (GaN) based materials have been developed, with shorter wavelengths in mind, and since lattice mismatch with GaN is remarkably small in SiC, in comparison with other compound semiconductors, SiC substrates have attracted attention as a substrate for epitaxially growing a GaN layer.

In this area of electronics, it is necessary to control the electronic conduction properties of a substrate in accordance with the purpose for use, and for example, a substrate having a low resistivity is required as a substrate for a semiconductor laser, and a substrate having high resistivity (semi-insulating properties) is required as a substrate for a high frequency device, so that the parasitic capacitance can be reduced, element isolation can be gained and the like.

A SiC substrate having low resistivity can be gained relatively easily, for example, by mixing a nitrogen gas with an argon gas, which is an atmospheric gas, in an improved Rayleigh method.

Meanwhile, a SiC substrate having high resistivity can be manufactured by cutting SiC single crystal containing vanadium and having high resistivity, as described in, for example, U.S. Pat. No. 5,611,955, PCT National Publication No. 2003-500321, and Japanese Patent Laying-Open No. 2003-104798. Such SiC single crystal containing vanadium and having high resistivity can be manufactured by adding highly pure metal vanadium to a highly pure SiC crystal powder, and by sublimating the metal vanadium together with SiC, so that vanadium is contained in the SiC single crystal.

The rate of sublimation of metal vanadium is high, however, and therefore, a great amount of vanadium is taken in by the SiC single crystal at the initial stage of the growth of the SiC single crystal, and thus, vanadium cannot be uniformly contained in the SiC single crystal. In addition, at the initial stage of growth, the amount of vanadium that is contained in the SiC single crystal exceeds the solubility limit, and at this point, deposition occurs and the crystallinity deteriorates, and therefore, deterioration in the crystallinity at this early stage of growth negatively affects the SiC single crystal that is grown afterwards. As a result of this, a problem arises, where SiC single crystal having high resistivity cannot be stably manufactured. In addition, a problem arises, where great dispersion is caused in the resistivity of a SiC substrate that is gained by cutting SiC single crystal.

As a means for solving this problem, Japanese Patent Laying-Open No. 2003-104798 discloses a method for manufacturing SiC crystal that contains vanadium in advance, and then converting it into powder form, and re-growing SiC single crystal that contains vanadium from this raw material in accordance with an improved Rayleigh method. In accordance with this method, however, it is necessary to manufacture SiC crystal that contains vanadium in advance, and therefore, a problem arises, where SiC single crystal having high resistivity cannot be efficiently manufactured.

In addition, a SiC substrate having high resistivity can be fabricated by increasing the purity of SiC single crystal instead of adding vanadium as described above. SiC single crystal that has been fabricated in accordance with a high temperature CVD method, which is a specialized chemical vapor deposition (CVD) method, for example, tends to have high purity. However, in order to gain highly pure SiC single crystal, it is necessary to preserve this high purity during the growing process (raw material, growing apparatus and the like), and it is very difficult to preserve high purity stably during the growing process.

SUMMARY OF THE INVENTION

An object of the present invention is to provide SiC single crystal and a SiC substrate having high resistivity. In addition, an object of the present invention is to provide a manufacturing method for SiC single crystal according to which SiC single crystal stably having high resistivity can be manufactured.

The present invention provides SiC single crystal that includes a first dopant functioning as an acceptor, and a second dopant functioning as a donor, where the content of the first dopant is no less than $5 \times 10^{15}$ atoms/cm$^3$, the content of the second dopant is no less than $5 \times 10^{15}$ atoms/cm$^3$, and the content of the first dopant is greater than the content of the second dopant.

Here, it is preferable, in the SiC single crystal of the present invention, for the content of the first dopant to be no less than $1 \times 10^{16}$ atoms/cm$^3$ and no greater than $1 \times 10^{17}$ atoms/cm$^3$.

In addition, it is preferable, in the SiC single crystal of the present invention, for the content of the second dopant to be no less than $1 \times 10^{16}$ atoms/cm$^3$.

In addition, it is preferable, in the SiC single crystal of the present invention, for the difference between the content of the first dopant and the content of the second dopant to be no greater than $5 \times 10^{16}$ atoms/cm$^3$.

In addition, it is preferable, in the SiC single crystal of the present invention, for the first dopant to be boron and for the second dopant to be nitrogen.

In addition, it is preferable, in the SiC single crystal of the present invention, for the resistivity at 25° C. to be no less than $1 \times 10^4$ Ωcm.

In addition, it is preferable, in the SiC single crystal of the present invention, for the resistivity at 25° C. to be no less than $1 \times 10^7$ Ωcm.

In addition, the present invention provides a SiC substrate made of SiC single crystal, as described above.

Furthermore, the present invention provided a manufacturing method for silicon carbide single crystal that includes the steps of: fabricating a raw material by mixing a metal boride with a material that includes carbon and silicon; vaporizing the raw material; generating a mixed gas that includes carbon, silicon, boron and nitrogen; and growing silicon carbide single crystal that includes boron and nitrogen on a surface of a seed crystal substrate by re-crystallizing the mixed gas on the surface of the seed substrate.

Here, it is preferable, in the manufacturing method for SiC single crystal of the present invention, for the metal boride to be at least one type of substance selected from the group of titanium boride, zirconium boride, hafnium boride, tantalum boride and niobium boride.

The present invention can provide SiC single crystal and a SiC substrate having high resistivity. In addition, the present invention can provide a manufacturing method for SiC single crystal according to which SiC single crystal having high resistivity can be stably manufactured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
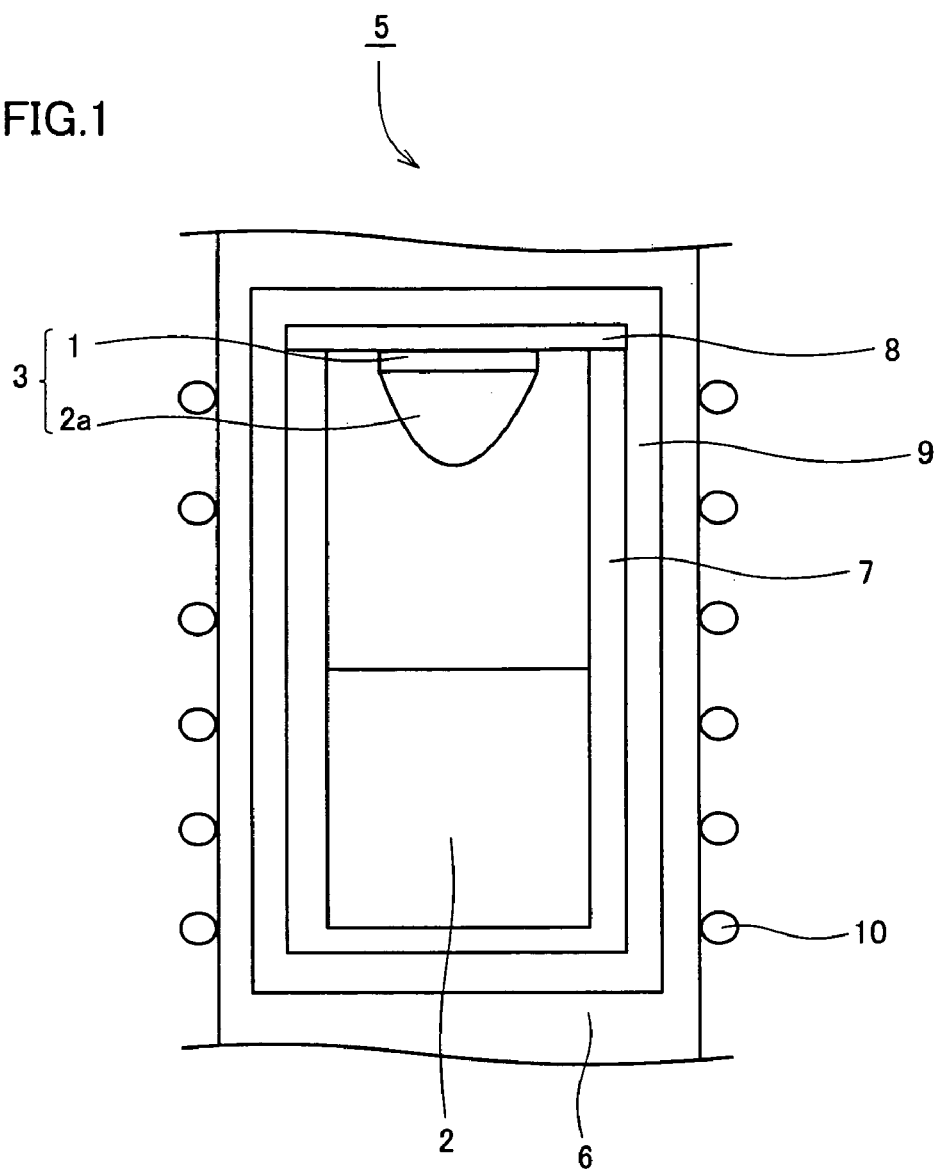
FIG. 1 is a schematic cross sectional diagram showing a preferable example of a SiC single crystal growing apparatus that is used in the present invention.

The present invention provides SiC single crystal that includes a first dopant functioning as an acceptor, and a second dopant functioning as a donor, wherein the content of the first dopant is no less than $5 \times 10^5$ atoms/cm$^3$, the content of the second dopant is no less than $5 \times 10^{15}$ atoms/cm$^3$, and the content of the first dopant is greater than the content of the second dopant. This is SiC single crystal having resistivity that is higher than that of pure p type SiC single crystal, and was gained as a result of diligent examination by the present inventor, during which it was found that in the case where the content of the first dopant functioning as an acceptor and the content of the second dopant functioning as a donor are both no less than $5 \times 10^{15}$ atoms/cm$^3$ in SiC single crystal, there is a great tendency for the first dopant and the second dopant to make electrons that have been introduced into the SiC single crystal scatter, and in addition, the content of the first dopant functioning as an acceptor is made greater than the content of the second dopant functioning as a donor, so that the second dopant functioning as a donor is compensated for with the first dopant functioning as an acceptor, and thus, the mobility of electrons in the SiC single crystal is lowered.

Here, it is preferable for the content of the first dopant in the SiC single crystal to be no less than $1 \times 10^{16}$ atoms/cm$^3$ and no greater than $1 \times 10^{17}$ atoms/cm$^3$. In the case where the content of the first dopant is less than $1 \times 10^{16}$ atoms/cm$^3$, the content of the first dopant in the SiC single crystal is too small, causing scattering of electrons due to the first dopant to be insufficient, and the SiC single crystal tends not to have high resistivity, and in the case where the content of the first dopant is greater than $1 \times 10^{17}$ atoms/cm$^3$, the crystallinity of the SiC single crystal tends to deteriorate.

In addition, it is preferable for the content of the second dopant in the SiC single crystal to be no less than $1 \times 10^{16}$ atoms/cm$^3$. In the case where the content of the second dopant is less than $1 \times 10^{16}$ atoms/cm$^3$, the content of the second dopant in the SiC single crystal is too small, causing scattering of electrons due to the second dopant to be insufficient, and the SiC single crystal tends not to have high resistivity.

In addition, it is preferable for the difference between the content of the first dopant and the content of the second dopant to be no greater than $5 \times 10^{16}$ atoms/cm$^3$. In the case where the difference between the content of the first dopant and the content of the second dopant is greater than $5 \times 10^{16}$ atoms/cm$^3$, reduction in the number of carriers due to the compensation between the first dopant and the second dopant is not sufficient, and the resistivity of the SiC single crystal tends to become low.

Here, the first dopant functioning as an acceptor is a dopant that functions as an electron receptor in SiC single crystal. Boron, aluminum and gallium, for example, can be cited as the first dopant, and in particular, boron is preferable. This is because boron has deep level and SiC single crystal that includes boron tends to have high resistivity.

In addition, the second dopant functioning as a donor is a dopant that functions as an electron donor in SiC single crystal. Nitrogen and phosphorous, for example, can be cited as the second dopant, and in particular, nitrogen is preferable. This is because in the case where nitrogen is used as the second dopant, the manufacture of SiC single crystal tends to become easy.

In addition, it is preferable for the resistivity of the SiC single crystal at 25° C. in the present invention to be no less than $1 \times 10^4$ Ωcm, and it is more preferable for it to be no less than $1 \times 10^7$ Ωcm. In the case where the resistivity of the SiC single crystal at 25° C. in the present invention is no less than $1 \times 10^4$ Ωcm, the SiC single crystal of the present invention is appropriate for use as a substrate for a semiconductor device that requires an insulating substrate. In addition, in the case where the resistivity at 25° C. is no less than $1 \times 10^7$ Ωcm, the SiC single crystal of the present invention is more appropriate for use as a substrate for a semiconductor device that requires an insulating substrate.

As a preferable example of a manufacturing method for such SiC single crystal of the present invention, there is a manufacturing method that includes the steps of: fabricating a raw material by mixing a metal boride with a material that includes carbon and silicon; vaporizing the raw material; generating a mixed gas that includes carbon, silicon, boron and nitrogen; and growing SiC single crystal that contains boron and nitrogen on a surface of a seed crystal substrate by re-crystallizing the mixed gas on the surface of the seed crystal substrate.

Here, a metal boride includes titanium boride, zirconium boride, hafnium boride, tantalum boride, niobium boride, aluminum boride, ytterbium boride, uranium boride, gadolinium boride, calcium boride, chromium boride, silicon boride, cobalt boride, strontium boride, tungsten boride, iron boride, copper boride, thorium boride, nickel boride, barium boride, magnesium boride, manganese boride, molybdenum boride and cerium boride.

In particular, it is preferable to use at least one type of substance selected from the group of titanium boride, zirconium boride, hafnium boride, tantalum boride and niobium boride as the metal boride. This is because these metal borides have a vapor pressure that is lower than that of single boron, and therefore, a large amount of boron is not taken in by SiC single crystal at the initial stage of growth of the SiC single crystal, unlike in the case where metal boron is used, and boron can be uniformly taken in by the SiC single crystal. In addition, the dimensions of atoms of boron in these metal borides are not so different from those of carbon, and therefore, boron tends to be taken into carbon sites in the SiC single crystal, while metal in the metal borides has atoms that are greater than those of silicon and carbon, and therefore, metal in the metal borides tends not to be taken into silicon sites and carbon sites in the SiC single crystal.

A raw material where a metal boride is mixed with a material that includes carbon and silicon is heated to a temperature of, for example, no lower than 2000° C. and no higher than 2800° C., so as to be vaporized into a vapor gas with which a nitrogen gas is then mixed, and thus, a mixed gas that includes carbon, silicon, boron and nitrogen is generated. Here, the content of boron in the mixed gas is made to be no less than $2 \times 10^{-3}$ mol % of the content of silicon in the mixed gas, and thereby, the content of boron in the SiC single crystal can be made to be no less than $5 \times 10^{15}$ atoms/cm$^3$. In addition, the content of nitrogen in the mixed gas is made to be no less than $2 \times 10^{-3}$ mol % of the content of silicon in the mixed gas, and thereby, the content of nitrogen in the SiC single crystal can be made to be no less than $5 \times 10^{15}$ atoms/cm$^3$. Thus, in the case where the content of boron in the mixed gas is made to be no less than $4 \times 10^{-3}$ mol % and no greater than $4 \times 10^{-1}$ mol % of silicon in the mixed gas by adjusting the mixed amount of the metal boride, the content of boron in the SiC single crystal can be made to be no less than $1 \times 10^{16}$ atoms/cm$^3$ and no greater than $1 \times 10^{17}$ atoms/cm$^3$. In addition, in the case where the content of nitrogen in the mixed gas is made to be no less than $4 \times 10^{-3}$ mol % of silicon in the mixed gas by adjusting the mixed amount of the nitrogen gas, the content of nitrogen in the SiC single crystal can be made to be no less than $1 \times 10^{16}$ atoms/cm$^3$. Thus, the difference in content between boron and nitrogen in the SiC single crystal can be made to be no greater than $5 \times 10^{16}$ atoms/cm$^3$, by appropriately adjusting the mixed amount of the metal boride and the mixed amount of the nitrogen gas.

Thus, this mixed gas is re-crystallized on a surface of a seed crystal substrate, and thereby, SiC single crystal is grown on the surface of the seed crystal substrate, and the SiC single crystal of the present invention can be manufactured.

The SiC single crystal that has been manufactured in this manner is cut, and thereby, a SiC substrate of the present invention can be manufactured.

EXAMPLES

Example 1

FIG. 1 is a schematic cross sectional diagram showing a SiC single crystal growing apparatus that is used in the present invention. This growing apparatus 5 includes a crucible 7 made of graphite that is installed inside a crystal tube 6, a lid 8 for closing the opening on the upper end of the crucible 7, a felt 9 made of graphite for heat shielding that is installed around crucible 7 and lid 8, and a work coil 10 that is installed so as to wind around the outer periphery of crystal tube 6. In addition, a seed crystal substrate 1 made of SiC is attached to the center of the lower surface of lid 8, and the inside of crucible 7 is filled in with a raw material 2.

Raw material 2 was manufactured by mixing $2 \times 10^{-2}$ mol % of titanium boride (TiB$_2$) relative to the amount of substance of silicon in raw material 2 with a SiC crystal powder. In addition, the pressure inside crucible 7 was once reduced to $10^{-5}$ Pa, and after that, an argon (Ar) gas was introduced, so that the inside of crucible 7 was filled with an Ar gas atmosphere, under a pressure of $1 \times 10^5$ Pa.

Then, a high frequency current was made to flow through work coil 10, so as to heat raw material 2 to 2200° C., and the pressure on the inside of crucible 7 was reduced to $1.3 \times 10^3$ Pa, so as to vaporize raw material 2, and this vaporous gas was mixed with a nitrogen gas so as to gain a mixed gas. The content of nitrogen in the mixed gas was $2 \times 10^{-2}$ mol % of the content of silicon in the mixed gas. In addition, heating was carried out by work coil 10, with a temperature gradient such that the temperature gradually decreased from raw material 2 to SiC seed crystal substrate 1. After that, the mixed gas was re-crystallized on the surface of SiC seed crystal substrate 1, and thereby, SiC single crystal 2a grew, and a SiC single crystal ingot 3 was gained.

Figure 2:
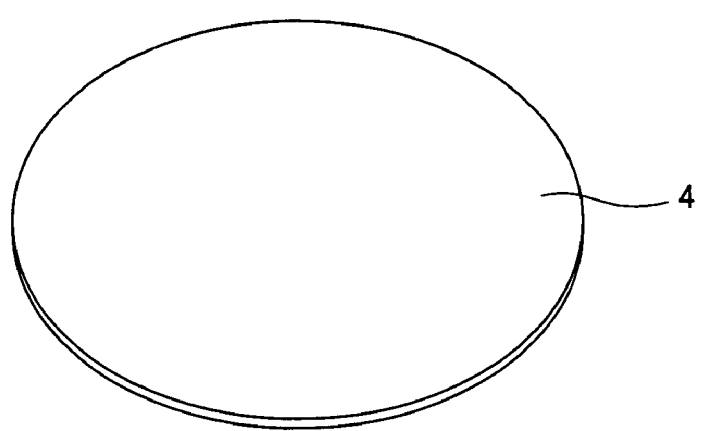
FIG. 2 is a schematic perspective diagram showing a preferable example of a SiC substrate of the present invention.

This SiC single crystal ingot 3 was cut into slices having a thickness of 400 μm, and a SiC substrate 4 in disc form having a diameter of 2 inches, as shown in FIG. 2, was manufactured. Then, the content of boron and nitrogen in this SiC substrate 4 was measured by means of SIMS (secondary ion mass spectrometry), and thus, the difference in content between boron and nitrogen was calculated. In addition, the resistivity of this SiC substrate was measured. The results are shown in Table 1. As shown in Table 1, the content of boron in this SiC substrate was $1 \times 10^7$ atoms/cm$^3$, and the content of nitrogen was $5 \times 10^{16}$ atoms/cm$^3$. In addition, the difference in content between boron and nitrogen was $5 \times 10^{16}$ atoms/cm$^3$. Furthermore, the resistivity of the SiC substrate was $1 \times 10^5$ Ωcm.

Example 2

A SiC substrate was manufactured in the same manner as in the example 1, except that the content of nitrogen in the mixed gas was made to be $3.5 \times 10^{-2}$ mol % of the content of silicon in the mixed gas. Then, the content of boron and nitrogen in this SiC substrate was measured in the same manner as in the example 1, and thus, the difference in content between boron and nitrogen was calculated. In addition, the resistivity of this SiC substrate was measured. The results are shown in Table 1. As shown in Table 1, the content of boron in this SiC substrate was $1 \times 10^{17}$ atoms/cm$^3$, and the content of nitrogen was $8 \times 10^{16}$ atoms/cm$^3$. In addition, the difference in content between boron and nitrogen was $2 \times 10^{16}$ atoms/cm$^3$. Furthermore, the resistivity of this SiC substrate was $1 \times 10^6$ Ωcm.

Example 3

A SiC substrate was manufactured in the same manner as in the example 1, except that $0.4 \times 10^{-2}$ mol % of TiB$_2$ relative to the amount of substance of silicon in raw material 2, shown in FIG. 1, was mixed in, and the content of nitrogen in the mixed gas was made to be $0.4 \times 10^{-2}$ mol % of the content of silicon in the mixed gas. Then, the content of boron and nitrogen in this SiC substrate was measured in the same manner as in the example 1, and thus, the difference in content between boron and nitrogen was calculated. In addition, the resistivity of this SiC substrate was measured. The results are shown in Table 1. As shown in Table 1, the content of boron in this SiC substrate was $2 \times 10^{16}$ atoms/cm$^3$, and the content of nitrogen was $1 \times 10^{16}$ atoms/cm$^3$. In addition, the difference in content between boron and nitrogen was $1 \times 10^{16}$ atoms/cm$^3$. Furthermore, the resistivity of this SiC substrate was $1 \times 10^7$ Ωcm.

Example 4

A SiC substrate was manufactured in the same manner as in the example 1, except that $2 \times 10^{-3}$ mol % of TiB$_2$ relative to the amount of substance of silicon in raw material 2, shown in FIG. 1, was mixed in, and the content of nitrogen in the mixed gas was made to be $2\times10^{-3}$ mol % of the content of silicon in the mixed gas. Then, the content of boron and nitrogen in this SiC substrate was measured in the same manner as in the example 1, and thus, the difference in content between boron and nitrogen was calculated. In addition, the resistivity of this SiC substrate was measured. The results are shown in Table 1. As shown in Table 1, the content of boron in this SiC substrate was $1\times10^{16}$ atoms/cm$^3$, and the content of nitrogen was $5\times10^{15}$ atoms/cm$^3$. In addition, the difference in content between boron and nitrogen was $5\times10^{15}$ atoms/cm$^3$. Furthermore, the resistivity of this SiC substrate was $1\times10^{7}$ Ωcm.

Example 5

A SiC substrate was manufactured in the same manner as in the example 1, except that $1.9\times10^{-3}$ mol % of TiB$_2$ relative to the amount of substance of silicon in raw material 2, shown in FIG. 1, was mixed in, and the content of nitrogen in the mixed gas was made to be $2\times10^{-3}$ mol % of the content of silicon in the mixed gas. Then, the content of boron and nitrogen in this SiC substrate was measured in the same manner as in the example 1, and thus, the difference in content between boron and nitrogen was calculated. In addition, the resistivity of this SiC substrate was measured. The results are shown in Table 1. As shown in Table 1, the content of boron in this SiC substrate was $9.5\times10^{15}$ atoms/cm$^3$, and the content of nitrogen was $5\times10^{15}$ atoms/cm$^3$. In addition, the difference in content between boron and nitrogen was $4.5\times10^{15}$ atoms/cm$^3$. Furthermore, the resistivity of this SiC substrate was $5\times10^{9}$ Ωcm.

Example 6

A SiC substrate was manufactured in the same manner as in the first example 1, except that $1.02\times10^{-3}$ mol % of TiB$_2$ relative to the amount of substance of silicon in raw material 2, shown in FIG. 1, was mixed in, and the content of nitrogen in the mixed gas was made to be $2\times10^{-3}$ mol % of the content of silicon in the mixed gas. Then, the content of boron and nitrogen in this SiC substrate was measured in the same manner as in the example 1, and thus, the difference in content between boron and nitrogen was calculated. In addition, the resistivity of this SiC substrate was measured. The results are shown in Table 1. As shown in Table 1, the content of boron in this SiC substrate was $5.1\times10^{15}$ atoms/cm$^3$, and the content of nitrogen was $5.0\times10^{15}$ atoms/cm$^3$. In addition, the difference in content between boron and nitrogen was $1.0\times10^{14}$ atoms/cm$^3$. Furthermore, the resistivity of this SiC substrate was $1.0\times10^{11}$ Ωcm.

Example 7

A SiC substrate was manufactured in the same manner as in the example 1, except that $2\times10^{-2}$ mol % of TiB$_2$ relative to the amount of substance of silicon in raw material 2, shown in FIG. 1, was mixed in, and the content of nitrogen in the mixed gas was made to be $1.6\times10^{-2}$ mol % of the content of silicon in the mixed gas. Then, the content of boron and nitrogen in this SiC substrate was measured in the same manner as in the example 1, and thus, the difference in content between boron and nitrogen was calculated. In addition, the resistivity of this SiC substrate was measured. The results are shown in Table 1. As shown in Table 1, the content of boron in this SiC substrate was $1\times10^{17}$ atoms/cm$^3$, and the content of nitrogen was $4\times10^{16}$ atoms/cm$^3$. In addition, the difference in content between boron and nitrogen was $6\times10^{16}$ atoms/cm$^3$. Furthermore, the resistivity of this SiC substrate was $1.1\times10^{2}$ Ωcm.

Comparison Example 1

A SiC substrate was manufactured in the same manner as in the example 1, except that $0.98\times10^{-3}$ mol % of TiB$_2$ relative to the amount of substance of silicon in raw material 2, shown in FIG. 1, was mixed in, and the content of nitrogen in the mixed gas was made to be $1\times10^{-3}$ mol % of the content of silicon in the mixed gas. Then, the content of boron and nitrogen in this SiC substrate was measured in the same manner as in the example 1, and thus, the difference in content between boron and nitrogen was calculated. In addition, the resistivity of this SiC substrate was measured. The results are shown in Table 1. As shown in Table 1, the content of boron in this SiC substrate was $4.9\times10^{15}$ atoms/cm$^3$, and the content of nitrogen was $2.5\times10^{15}$ atoms/cm$^3$. In addition, the difference in content between boron and nitrogen was $2.4\times10^{15}$ atoms/cm$^3$. Furthermore, the resistivity of this SiC substrate was $1\times10^{4}$ Ωcm.

Comparison Example 2

A SiC substrate was manufactured in the same manner as in the example 1, except that $2\times10^{-3}$ mol % of TiB$_2$ relative to the amount of substance of silicon in raw material 2, shown in FIG. 1, was mixed in, and the content of nitrogen in the mixed gas was made to be $1\times10^{-2}$ mol % of the content of silicon in the mixed gas. Then, the content of boron and nitrogen in this SiC substrate was measured in the same manner as in the example 1, and thus, the difference in content between boron and nitrogen was calculated. In addition, the resistivity of this SiC substrate was measured. The results are shown in Table 1. As shown in Table 1, the content of boron in this SiC substrate was $1\times10^{16}$ atoms/cm$^3$, and the content of nitrogen was $2.5\times10^{16}$ atoms/cm$^3$. In addition, the difference in content between boron and nitrogen was $-1.5\times10^{16}$ atoms/cm$^3$. Furthermore, the resistivity of this SiC substrate was $1\times10^{-1}$ Ωcm.

TABLE 1

| | SiC single crystal | | | |
| --- | --- | --- | --- | --- |
| | Content (1) of boron (per atoms/cm$^3$) | Content (2) of nitrogen (per atoms/cm$^3$) | (1)-(2) (per atoms/cm$^3$) | SiC substrate Resistivity (Ωcm) |
| Example 1 | $1\times10^{17}$ | $5\times10^{16}$ | $5\times10^{16}$ | $1\times10^{5}$ |
| Example 2 | $1\times10^{17}$ | $8\times10^{16}$ | $2\times10^{16}$ | $1\times10^{6}$ |
| Example 3 | $2\times10^{16}$ | $1\times10^{16}$ | $1\times10^{16}$ | $1\times10^{7}$ |
| Example 4 | $1\times10^{16}$ | $5\times10^{15}$ | $5\times10^{15}$ | $1\times10^{7}$ |
| Example 5 | $9.5\times10^{15}$ | $5\times10^{15}$ | $4.5\times10^{15}$ | $5\times10^{9}$ |
| Example 6 | $5.1\times10^{15}$ | $5\times10^{15}$ | $1\times10^{14}$ | $1\times10^{11}$ |
| Example 7 | $1\times10^{17}$ | $4\times10^{16}$ | $6\times10^{16}$ | $1.1\times10^{2}$ |

TABLE 1-continued

|  | SiC single crystal | | | SiC substrate Resistivity ($\Omega$cm) |
|---|---|---|---|---|
|  | Content (1) of boron (per atoms/cm$^3$) | Content (2) of nitrogen (per atoms/cm$^3$) | (1)-(2) (per atoms/cm$^3$) | |
| Comparison Example 1 | $4.9 \times 10^{15}$ | $2.5 \times 10^{15}$ | $2.4 \times 10^{15}$ | $1 \times 10^4$ |
| Comparison Example 2 | $1 \times 10^{16}$ | $2.5 \times 10^{16}$ | $-1.5 \times 10^{16}$ | $1 \times 10^{-1}$ |

As shown in Table 1, SiC substrates of the examples 1 to 7, where, as shown in Table 1, the content of boron was no less than $5 \times 10^{15}$ atoms/cm$^3$, the content of nitrogen was no less than $5 \times 10^{15}$ atoms/cm$^3$, and the content of boron was greater than the content of nitrogen had resistivity that was considerably greater than that of the SiC substrate of Comparison Example 1, where the content of boron and the content of nitrogen were both less than $5 \times 10^{15}$ atoms/cm$^3$, and that of the SiC substrate of Comparison Example 2, where the content of boron was smaller than the content of nitrogen.

In addition, as shown in Table 1, SiC substrates of the examples 1 to 6, where, as shown in Table 1, the difference in content between boron and nitrogen was no greater than $5 \times 10^{16}$ atoms/cm$^3$, had resistivity that was considerably greater than that of the SiC substrate of the example 7, where the difference was $6 \times 10^{16}$ atoms/cm$^3$.

In addition, as shown in Table 1, in the SiC substrates of the examples 1 to 7, the smaller the difference in content between boron and nitrogen was, the higher the resistivity of the SiC substrates tended to be.

Here, though TiB$_2$ was used as a metal boride in the above-described example, the same effects as those in the above-described examples can, of course, be gained even in the case where a metal boride other than TiB$_2$ is used.

As described above, according to the present invention, p type SiC single crystal and a SiC substrate having high resistivity can be stably gained. Accordingly, the present invention is appropriate for application to high frequency devices, in particular, switching elements having a high operation frequency in the field of semiconductor devices.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A silicon carbide single crystal which comprises a first dopant consisting of boron functioning as an acceptor, and a second dopant consisting of nitrogen functioning as a donor, wherein the silicon carbide single crystal contains only boron and nitrogen as dopants, the content of said first dopant and said second dopant is not less than $1 \times 10^{16}$ atoms/cm$^3$, the content of said first dopant is greater than the content of said second dopant, the content of said first dopant is not less than $1 \times 10^{16}$ atoms/cm$^3$ and no greater than $1 \times 10^{17}$ atoms/cm$^3$, and the difference in content between said first dopant and said second dopant is not greater than $5 \times 10^{16}$ atoms/cm$^3$.

2. The silicon carbide single crystal according to claim 1, wherein the resistivity at 25° C. is not less than $1 \times 10^4$ $\Omega$cm.

3. The silicon carbide single crystal according to claim 1, wherein the resistivity at 25° C. is not less than $1 \times 10^7$ $\Omega$cm.

4. A manufacturing method for silicon carbide single crystal, comprising the steps of:
fabricating a raw material by mixing a metal boride with a material that includes carbon and silicon;
vaporizing said raw material;
generating a mixed gas that includes carbon, silicon, boron and nitrogen; and
growing silicon carbide single crystal that includes boron and nitrogen on a surface of a seed crystal substrate by re-crystallizing said mixed gas on the surface of said seed crystal substrate to produce a silicon carbide single crystal which comprises a first dopant consisting of boron functioning as an acceptor, and a second dopant consisting of nitrogen functioning as a donor, wherein the silicon carbide single crystal contains only boron and nitrogen as dopants, the content of said first dopant and said second dopant is not less than $1 \times 10^{16}$ atoms/cm$^3$, the content of said first dopant is greater than the content of said second dopant, the content of said first dopant is not less than $1 \times 10^{16}$ atoms/cm$^3$ and no greater than $1 \times 10^{17}$ atoms/cm$^3$, and the difference in content between said first dopant and said second dopant is not greater than $5 \times 10^{16}$ atoms/cm$^3$.

5. The manufacturing method for silicon carbide single crystal according to claim 4, characterized in that said metal boride is at least one type of substance selected from the group of titanium boride, zirconium boride, hafnium boride, tantalum boride and niobium boride.

* * * * *